United States Patent
Wang

(10) Patent No.: US 11,893,800 B2
(45) Date of Patent: Feb. 6, 2024

(54) SCENE REPRODUCTION TEST METHOD, APPARATUS, DEVICE AND PROGRAM PRODUCT OF AUTONOMOUS DRIVING SYSTEM

(71) Applicant: Apollo Intelligent Connectivity (Beijing) Technology Co., Ltd., Beijing (CN)

(72) Inventor: Xiaolong Wang, Beijing (CN)

(73) Assignee: Apollo Intelligent Connectivity (Beijing) Technology Co., Ltd., Beijing (CN)

( * ) Notice: Subject to any disclaimer, the term of this patent is extended or adjusted under 35 U.S.C. 154(b) by 406 days.

(21) Appl. No.: 17/463,624

(22) Filed: Sep. 1, 2021

(65) Prior Publication Data

US 2021/0397856 A1 Dec. 23, 2021

(30) Foreign Application Priority Data

Feb. 18, 2021 (CN) .......................... 202110187446.X

(51) Int. Cl.
*G06V 20/56* (2022.01)
*G06V 20/58* (2022.01)
(Continued)

(52) U.S. Cl.
CPC ........... *G06V 20/58* (2022.01); *B60W 30/095* (2013.01); *B60W 60/001* (2020.02); *G06F 30/20* (2020.01); *B60W 2554/404* (2020.02)

(58) Field of Classification Search
CPC .. G01C 21/3881; G01S 7/006; G06K 7/1413; G06K 9/00791; G08G 1/005; H04W 4/44; H04W 4/029; G06T 7/50; B60W 30/08
See application file for complete search history.

(56) References Cited

U.S. PATENT DOCUMENTS

2019/0009789 A1 1/2019 Zhang
2019/0049342 A1 2/2019 Anderson
(Continued)

FOREIGN PATENT DOCUMENTS

CN 109211574 A 1/2019
CN 109495530 A 3/2019
(Continued)

OTHER PUBLICATIONS

Chinese Office Action for corresponding CN Application No. 202110187446.X, 11 pages.
(Continued)

*Primary Examiner* — Phuoc H Doan
(74) *Attorney, Agent, or Firm* — Tucker Ellis LLP

(57) ABSTRACT

A scene reproduction test method, apparatus, device and program product of an autonomous driving system are provided by the present application. The method includes: obtaining problematic scene data generated during a test on an autonomous driving vehicle equipped with a first autonomous driving system, and determining key obstacle information and non-key obstacle information according to the problematic scene data; generating, according to the non-key obstacle information, a virtual obstacle model, and determining, according to the key obstacle information, a real device used to simulate a key obstacle; where the real device is a device that actually exists in a test environment; performing, by utilizing the virtual obstacle model and the real device, a reproduction test on an autonomous driving vehicle equipped with a second autonomous driving system. In the solution, the test object is a real autonomous driving vehicle, and the key obstacle is a real device.

20 Claims, 5 Drawing Sheets

(51) Int. Cl.
  *G06F 30/20* (2020.01)
  *B60W 60/00* (2020.01)
  *B60W 30/095* (2012.01)

(56) References Cited

U.S. PATENT DOCUMENTS

| | | |
|---|---|---|
| 2019/0220678 A1 | 7/2019 | Guo et al. |
| 2020/0082573 A1 | 3/2020 | Zhang et al. |
| 2020/0183387 A1 | 6/2020 | Heit et al. |
| 2020/0377109 A1 | 12/2020 | Yang |
| 2021/0166474 A1* | 6/2021 | Behar ................... G06V 20/56 |
| 2022/0227397 A1* | 7/2022 | Jiang ............... B60W 30/18109 |

FOREIGN PATENT DOCUMENTS

| | | |
|---|---|---|
| CN | 109781431 A | 5/2019 |
| CN | 109993849 A | 7/2019 |
| CN | 110276947 A | 9/2019 |
| CN | 110795818 A | 2/2020 |
| CN | 111142402 A | 5/2020 |
| CN | 111226268 A | 6/2020 |
| CN | 111611711 A | 9/2020 |
| CN | 111859618 A | 10/2020 |
| CN | 112015164 A | 12/2020 |
| CN | 112198859 A | 1/2021 |
| EP | 3 745 231 A1 | 12/2020 |
| JP | 2020-119509 A | 8/2020 |
| KR | 10-2011664 B1 | 8/2019 |
| KR | 102139172 B1 | 7/2020 |
| WO | 2018/066351 A1 | 4/2018 |
| WO | 2020/168788 A1 | 8/2020 |

OTHER PUBLICATIONS

Translation of Chinese Office Action for corresponding Chinese Application No. 202110187446, 15 pages.
European Search Report for corresponding EP Application No. 21192729.8, dated Feb. 10, 2022, 7 pages.
Notification to Grant Patent Right for Invention for corresponding Chinese Patent Application No. 202110187446X, dated Jul. 29, 2022, 6 pages.
Notice of Reasons for Refusal of corresponding Japanese Application No. 2021-200290, dated Dec. 12, 2022, 6 pages.
Notice of Allowance for Patent for corresponding Korean Application No. 10-2021-0118860, dated Aug. 8, 2023, 5 pages.

* cited by examiner

SCENE REPRODUCTION TEST METHOD, APPARATUS, DEVICE AND PROGRAM PRODUCT OF AUTONOMOUS DRIVING SYSTEM

CROSS-REFERENCE TO RELATED APPLICATIONS

The present application claims priority to Chinese Patent Application No. 202110187446.X, which was filed on Feb. 18, 2021 and titled "reproduction test method, apparatus, device and program product of autonomous driving system". The disclosure of the above patent application is incorporated herein by reference in its entirety.

TECHNICAL FIELD

The present application relates to autonomous driving technologies in the field of computer, and particularly to a scene reproduction test method, apparatus, device, and program product of an autonomous driving system.

BACKGROUND

Currently, autonomous driving technologies are becoming more and more mature, and vehicles equipped with an autonomous driving system also rolled off production lines successfully. In order to ensure that these autonomous driving vehicles can drive on roads safely, it is necessary to test these autonomous driving vehicles.

In the prior art, an autonomous driving vehicle may be controlled to perform a test on open roads, and an autonomous driving system in the autonomous driving vehicle may be adjusted according to a test result.

Since scenes encountered on open roads are highly random, a scene where a problem occurs during a test is hard to encounter again, causing that after the problem is fixed, whether the problem has been effectively solved cannot be verified based on a real vehicle.

SUMMARY

According to a first aspect of the present application, there is provided a scene reproduction test method of an autonomous driving system, including:
  obtaining problematic scene data generated during a test on an autonomous driving vehicle equipped with a first autonomous driving system, and determining key obstacle information and non-key obstacle information according to the problematic scene data;
  generating, according to the non-key obstacle information, a virtual obstacle model, and determining, according to the key obstacle information, a real device used to simulate a key obstacle; where the real device is a device that actually exists in a test environment;
  performing, by utilizing the virtual obstacle model and the real device, a reproduction test on an autonomous driving vehicle equipped with a second autonomous driving system; where the second autonomous driving system is a system obtained after the first autonomous driving system is optimized; the reproduction test is used to perform a reproduction test in a problematic scene represented by the problematic scene data.

According to a second aspect of the present application, there is provided an electronic device, including:
  at least one processor; and
  a memory communicatively connected with the at least one processor; where,
  the memory stores instructions executable by the at least one processor, and the instructions are executed by the at least one processor to enable the at least one processor to execute the scene reproduction test method of an autonomous driving system according to the first aspect.

According to a third aspect of the present application, there is provided a non-transitory computer-readable storage medium storing computer instructions, where the computer instructions are used to cause a computer to execute the scene reproduction test method of an autonomous driving system according to the first aspect.

It should be understood that content described in this section is neither intended to identify a key or important feature of embodiments of the present application, nor to limit the scope of the present application. Other features of the present application will become easy to understand through the following description.

BRIEF DESCRIPTION OF DRAWINGS

Drawings are used to better understand the present solution, and do not constitute a limitation to the present application. Among them.

DESCRIPTION OF EMBODIMENTS

Figure 1:
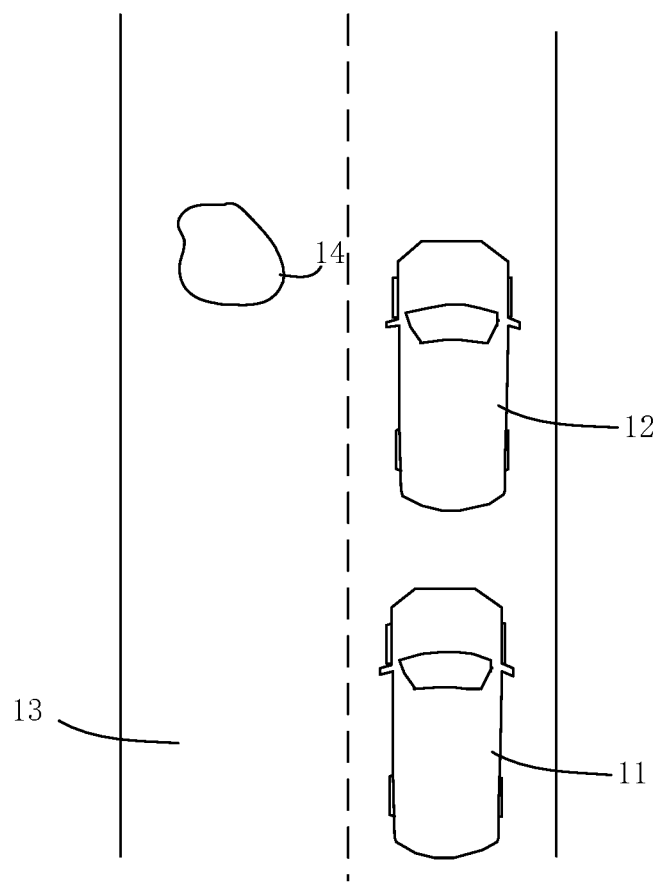
FIG. 1 is an application scenario diagram shown in an illustrative embodiment of the present application.

Exemplary embodiments of the present application are illustrated below in conjunction with the drawings, where various details of the embodiments of the present application are included to facilitate understanding, and they should be regarded as merely exemplary. Therefore, those of ordinary skill in the art should realize that various changes and modifications may be made to the embodiments described herein without departing from the scope and the spirit of the present application. Likewise, for clarity and conciseness, descriptions of well-known functions and structures are omitted in the following description.

In order to test an autonomous driving system, a vehicle equipped with an autonomous driving system may be controlled to drive on an open road. During the driving of the vehicle, an on-board computer equipped with the autonomous driving system can formulate a driving strategy according to an external environment of the vehicle, and then control the vehicle to drive.

Due to the ever-changing road environment, the vehicle may encounter a problematic scene where the autonomous driving system cannot handle safely during driving. The problematic scene refers to a scene in which there is a safety problem when the vehicle is controlled to drive based on the autonomous driving system.

The present application provides a scene reproduction test method, apparatus, device, and program product of an autonomous driving system, so as to solve the technical problem in the prior art that since scenes encountered on open roads are highly random, a scene where a problem occurs during a test is hard to encounter again, causing that after the problem is fixed, whether the problem has been effectively solved cannot be verified based on a real vehicle.

The scene reproduction test method, apparatus, device, and program product of an autonomous driving system provided by the present application include: obtaining problematic scene data generated during a test on an autonomous driving vehicle equipped with a first autonomous driving system, and determining key obstacle information and non-key obstacle information according to the problematic scene data; generating, according to the non-key obstacle information, a virtual obstacle model and determining, according to the key obstacle information, a real device used to simulate a key obstacle; where the real device is a device that actually exists in a test environment; performing, by utilizing the virtual obstacle model and the real device, a reproduction test on an autonomous driving vehicle equipped with a second autonomous driving system; where the second autonomous driving system is a system obtained after the first autonomous driving system is optimized; and the reproduction test is used to perform a reproduction test in a problematic scene represented by the problematic scene data. In the solution provided by the present application, the virtual obstacle model and the real device can be used to reproduce the problematic scene, then the autonomous driving vehicle equipped with the second autonomous driving system can be tested in the reproduced problematic scene. The test object is a real autonomous driving vehicle, and the key obstacle is a real device, and thus, the problematic scene can be better reproduced and thereby an accurate test result is obtained.

FIG. 1 is an application scenario diagram shown in an illustrative embodiment of the present application.

As shown in FIG. 1, there is an obstacle vehicle 12 in front of a vehicle 11, and an autonomous driving system in the vehicle 11 determines a driving strategy based on a current road environment, which is to control the vehicle 11 to make a lane change and enter into a first lane 13.

Assuming that there is an obstacle 14 in the first lane, if the vehicle 11 enters into the first lane 13 based on the current driving strategy, the vehicle may collide with the obstacle 14.

In this case, if the autonomous driving system does not update the driving strategy to control the vehicle 11 to avoid the obstacle 14, the current scene may be regarded as a problematic scene.

Specifically, if a problematic scene is encountered during a test, a tester may control the vehicle to avoid a traffic accident.

Since the autonomous driving system cannot handle the problematic scene safely, the autonomous driving system may be optimized to solve the problem. However, since a problematic scene encountered during a test on an open road is highly random, it is hard to encounter the problematic scene again. As a result, even if the autonomous driving system is optimized, a regression test cannot be performed based on a vehicle equipped with the optimized autonomous driving system, and then it cannot be determined whether the problematic scene can be effectively solved.

In order to solve the above technical problem, in the solution provided by the present application, a virtual combination technology may be adopted to reproduce the problematic scene, and then a reproduction test can be performed on the vehicle equipped with the optimized autonomous driving system in the reproduced problematic scene. Specifically, key obstacle information and non-key obstacle information may be determined according to problematic scene data generated during a test, and for a key obstacle, a real device may be used to reproduce it, and for a non-key obstacle, a virtual technology may be used to construct it, and then the problematic scene can be reproduced.

The present application provides a scene reproduction test method, apparatus, device, and program product of an autonomous driving system, which are applied in autonomous driving technologies in the field of computer, so as to better reproduce a problematic scene encountered during a test on an autonomous driving vehicle equipped with the autonomous driving system on an open road, and then a reproduction test can be performed on the optimized autonomous driving system by utilizing the reproduced problematic scene.

Figure 2:
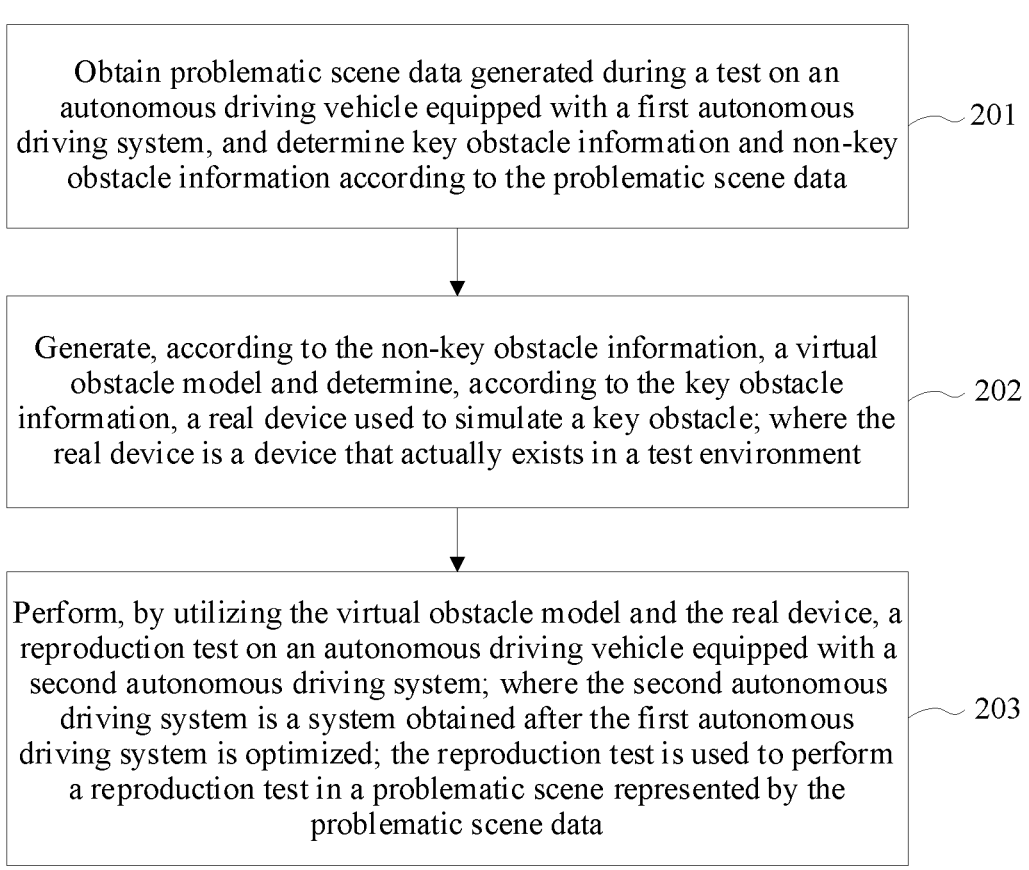
FIG. 2 is a schematic flowchart of a scene reproduction test method of an autonomous driving system shown in an illustrative embodiment of the present application.

FIG. 2 is a schematic flowchart of a scene reproduction test method of an autonomous driving system shown in an illustrative embodiment of the present application.

As shown in FIG. 2, the scene reproduction test method of an autonomous driving system provided by the present application includes:

Step 201, obtain problematic scene data generated during a test on an autonomous driving vehicle equipped with a first autonomous driving system, and determine key obstacle information and non-key obstacle information according to the problematic scene data.

The method provided in the present application may be set in a scene reproduction test system, and the scene reproduction test system may be provided in one or more electronic devices. For example, the scene reproduction test system may include multiple modules, and the modules may be provided in different electronic devices.

Specifically, when a reproduction test is performed, problematic scene data may be obtained firstly. The problematic scene data is problematic scene data generated during a test on the autonomous driving vehicle equipped with the first autonomous driving system.

Further, when the autonomous driving vehicle equipped with the first autonomous driving system is tested, the first autonomous driving system may record road test data, for example, a driving state of the vehicle at each moment, and for another example, obstacle information in an external environment of the vehicle at each moment.

If there is a problem during the test, the problematic scene data when the problem occurs may be obtained from the road test data. For example, a tester may determine a time when the problem occurs during the driving of the vehicle according to an actual test situation, and thus corresponding problematic scene data may be obtained from the road test data according to the time. For example, if the time when a problem occurs is 12:00, data of 60 seconds before 12:00 and data of 60 seconds after 12:00 may be obtained from the road test data as the problematic scene data corresponding to the problematic scene.

In practical applications, the scene reproduction test system may determine the key obstacle information and the non-key obstacle information according to the obtained problematic scene data.

In an implementation, a rule used to distinguish between a key obstacle and a non-key obstacle may be set in advance.

For example, a moving obstacle may be taken as a key obstacle, and the moving obstacle may be, for example, a moving person, a moving car, etc. A stationary obstacle may be taken as a non-key obstacle, and the stationary obstacle may be, for example, a car that is not moving, and for another example, may be roadside vegetation, street lights and other devices.

For another example, it is also possible to take an obstacle whose distance to the autonomous driving vehicle is less than a distance threshold as a key obstacle, and take an obstacle whose distance to the autonomous driving vehicle is greater than the distance threshold as a non-key obstacle.

In another implementation, a key obstacle in the problematic scene data may be specified by a user according to the problematic scene data. For example, the scene reproduction test system may visually display the problematic scene according to the problematic scene data, for example, the scene in which the vehicle is tested may be displayed by means of a video, obstacles around the vehicle are included in the displayed problematic scene, and the user may mark a key obstacle in the displayed problematic scene as required.

In this implementation, an unmarked obstacle is a non-key obstacle.

The scene reproduction test system may take information of a key obstacle in the problematic scene data as key obstacle information, and take information of a non-key obstacle in the problematic scene data as non-key obstacle information.

Step 202, generate, according to the non-key obstacle information, a virtual obstacle model and determine, according to the key obstacle information, a real device used to simulate a key obstacle; where the real device is a device that actually exists in a test environment.

Specifically, the key obstacle may be regarded as an obstacle that has a great effect on formulation of a driving strategy by the autonomous driving system, and the non-key obstacle may be regarded as an obstacle that does not have great effect on formulation of the driving strategy by the autonomous driving system. Therefore, a real device may be used to simulate a key obstacle, and a virtual model may be used to simulate a non-key obstacle.

Further, the scene reproduction test system may generate a virtual obstacle model according to the non-key obstacle information, for example, generate a virtual obstacle model used to simulate a non-key obstacle according to a size, a contour, etc., of the non-key obstacle.

A virtual scene generation controller may be provided, and the scene reproduction test system may utilize the virtual scene generation controller to generate a virtual obstacle model.

In practical applications, the scene reproduction test system may also determine a real device used to simulate the key obstacle according to the key obstacle information. For example, a real device that can simulate a corresponding key obstacle may be determined according to the contour and the size of the obstacle included in the key obstacle information. For example, if the key obstacle is a car, a controllable vehicle may be taken as a real device used to simulate the obstacle vehicle. For another example, if a key obstacle is a pedestrian, a controllable robot may be taken as a real device used to simulate the pedestrian.

Further, the real device used to simulate the key obstacle is a device that actually exists in a test environment, such as a car, a robot, or other controllable devices.

The real device may be placed in a closed road environment, and then the problematic scene may be highly reproduced in the closed road environment.

Step 203, perform, by utilizing the virtual obstacle model and the real device, a reproduction test on an autonomous driving vehicle equipped with a second autonomous driving system; where the second autonomous driving system is a system obtained after the first autonomous driving system is optimized; the reproduction test is used to perform a reproduction test in a problematic scene represented by the problematic scene data.

In practical applications, if a problematic scene is found when the autonomous driving vehicle equipped with the first autonomous driving system is tested, the first autonomous driving system may be optimized to obtain the second autonomous driving system, so that the autonomous driving system can deal with the problematic scene.

A reproduction test may be performed on the autonomous driving vehicle equipped with the second autonomous driving system, so as to verify whether the second autonomous driving system can formulate a reasonable and safe driving strategy when the same problematic scene is encountered.

Specifically, the problematic scene may be reproduced by utilizing the generated virtual obstacle model and the determined real device, and then a reproduction test may be performed on the autonomous driving vehicle equipped with the second autonomous driving system in the reproduced problematic scene, where the reproduction test is specifically used to perform a reproduction test in the problematic scene represented by the problematic scene data.

Further, during the test, the virtual obstacle may be controlled to move by utilizing the non-key obstacle information corresponding to the virtual obstacle model. The real device may also be controlled to move by utilizing the key obstacle information corresponding to the real device. For example, if the key obstacle information determined according to the problematic scene data includes positions of a first key obstacle at respective moments of the problematic scene, a first real device that is used to simulate the first key obstacle may be controlled to move according to this information, so that the first real device can simulate a movement trajectory of the first key obstacle.

In practical applications, the virtual obstacle model and the real device may also be controlled in conjunction with a start time of the autonomous driving vehicle equipped with the second autonomous driving system. For example, the virtual obstacle model and the real device may be controlled to move according to relative positions between the autonomous driving vehicle and the virtual obstacle model as well as the real device after the autonomous driving vehicle is started.

For example, the virtual obstacle may be controlled to move by utilizing the non-key obstacle information corresponding to the virtual obstacle model and the real device may be controlled to move by utilizing the key obstacle information corresponding to the real device, when the relative positions between the autonomous driving vehicle and the virtual obstacle model as well as the real device meet relative positions between the vehicle and the obstacles represented by data corresponding to an initial moment in the problematic scene data.

In this implementation, the test object is the autonomous driving vehicle equipped with the second autonomous driving system, and the key obstacle is a real device, thereby better reproducing the problematic scene and completing the test.

During the test, the autonomous driving vehicle may be controlled to drive on a closed road, and then the reproduction test may be performed in the problematic scene, which is encountered on an open road, on the closed road.

The scene reproduction test method of an autonomous driving system provided by the present application includes: obtaining problematic scene data generated during a test on an autonomous driving vehicle equipped with a first autonomous driving system, and determining key obstacle information and non-key obstacle information according to the problematic scene data; generating, according to the non-key obstacle information, a virtual obstacle model, and determining, according to the key obstacle information, a real device used to simulate a key obstacle; where the real device is a device that actually exists in a test environment; performing, by utilizing the virtual obstacle model and the real device, a reproduction test on an autonomous driving vehicle equipped with a second autonomous driving system; where the second autonomous driving system is a system obtained after the first autonomous driving system is optimized; and the reproduction test is used to perform a reproduction test in a problematic scene represented by the problematic scene data. In the method provided in the present application, the virtual obstacle model and the real device can be used to restore the problematic scene, and then the autonomous driving vehicle equipped with the second autonomous driving system can be tested in the reproduced problematic scene, where the test object is a real autonomous driving vehicle, and the key obstacle is a real device, and thus, the problematic scene can be better reproduced, and thereby an accurate test result is obtained.

Figure 3:
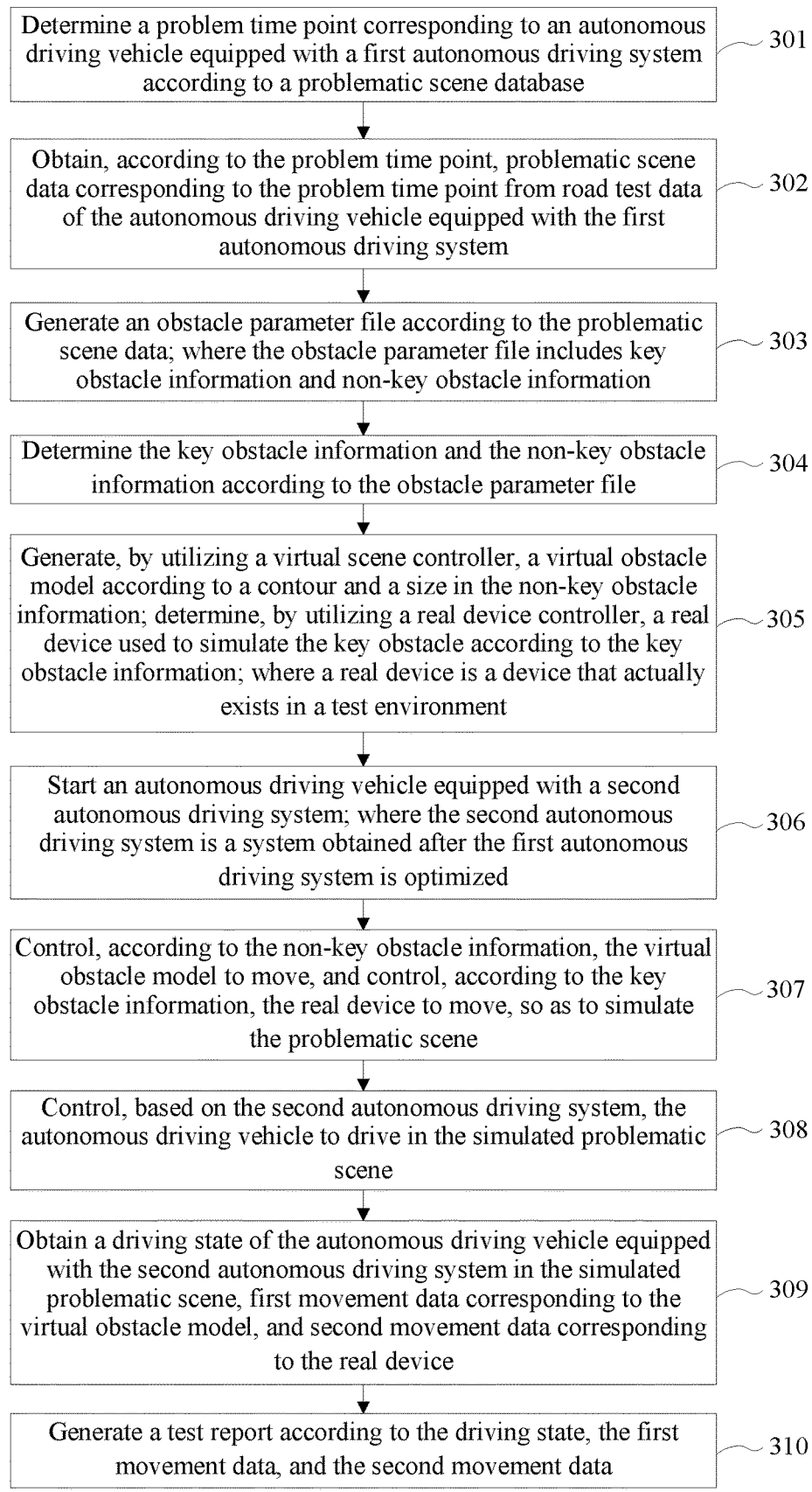
FIG. 3 is a schematic flowchart of a scene reproduction test method of an autonomous driving system shown in an illustrative embodiment of the present application.

FIG. 3 is a schematic flowchart of a scene reproduction test method of an autonomous driving system shown in an illustrative embodiment of the present application.

As shown in FIG. 3, the scene reproduction test method of an autonomous driving system provided by the present application includes:

Step 301, determine a problem time point corresponding to an autonomous driving vehicle equipped with a first autonomous driving system according to a problematic scene database.

The method provided in the present application may be set in a scene reproduction test system, and the scene reproduction test system may be provided in one or more electronic devices. For example, the scene reproduction test system may include multiple modules, and the modules may be provided in different electronic devices.

Specifically, a problematic scene database may be provided, and the problematic scene database may store information about multiple problematic scenes. During a test, a tester may enter information of the problematic scene according to a test situation.

For example, when riding a vehicle equipped with an autonomous driving system and performing a road test, the tester finds that there is a problem when the autonomous driving system controls the vehicle to drive, for example, a situation of an unreasonable sudden brake, then the tester may enter a time when the situation occurs into the problematic scene database, and the tester may also add descriptive information of the problematic scene into the problematic scene database, for example, the descriptive information may be "an unreasonable sudden brake".

Further, after the first autonomous driving system is optimized based on the problematic scene to obtain the second autonomous driving system, a reproduction test may be performed on the second driving system. During the test, specifically, a problem time point corresponding to the autonomous driving vehicle equipped with the first autonomous driving system may be determined according to the data in the problematic scene database, and the problematic scene corresponding to the time point may be one or more optimized problematic scenes.

Step 302, obtain, according to the problem time point, problematic scene data corresponding to the problem time point from road test data of the autonomous driving vehicle equipped with the first autonomous driving system.

In practical applications, when the autonomous driving vehicle equipped with the first autonomous driving system is tested, the road test data is generated. For example, the road test data may include a driving state of the vehicle, and may also include information about a surrounding environment sensed by the first autonomous driving system, for example, obstacle information, and the obstacle information may also specifically include information of any one or more of a size, a contour, a position, a speed and a course of the obstacle.

According to the problem time point, the problematic scene data corresponding to the problem time point may be obtained from the road test data of the autonomous driving vehicle equipped with the first autonomous driving system. Then, data of the problematic scene encountered at the problem time point during the test is obtained. In this implementation, the problematic scene data corresponding to the problematic scene may be obtained accurately, and then the problematic scene can be reproduced based on the data generated during the actual road test, so that the reproduced scene is more similar to the actual road scene.

Specifically, from the road test data of the autonomous driving vehicle equipped with the first autonomous driving system, first data which has a data generation time within a preset time period before the problem time point and second data which has a data generation time within a preset time period after the problem time point are taken as the problematic scene data. The preset time period may be set as required, for example, it may be set as 60 s, and on this occasion, first data of 60 s before the problem time point and second data of 60 s after the problem time point may be obtained from the road test data and be taken as the problematic scene data. For example, if the problem time point is 14:00, road test data generated before and after 14:00 on the test day may be obtained, for example, it may be data of 60 s before 14:00 and data of 60 s after 14:00, and be taken as the problematic scene data.

In this implementation, the road test data within time periods before and after the problem time point may be extracted as the problematic scene data, the data can reflect changes of the vehicle and the surrounding environment in the problematic scene, and then the problematic scene can be reproduced based on the obtained problematic scene data, so that the reproduced scene is more similar to the actual road scene.

Step 303, generate an obstacle parameter file according to the problematic scene data; where the obstacle parameter file includes key obstacle information and non-key obstacle information.

The obstacle parameter file including the key obstacle information and the non-key obstacle information may be generated according to the problematic scene data.

Specifically, a key obstacle and a non-key obstacle in the scene may be determined according to the problematic scene data. Obstacles included in the scene may be determined according to the problematic scene data, and the obstacles may be distinguished to a key obstacle and a non-key obstacle, and then the obstacle parameter file may be generated according to information of the key obstacle and information of the non-key obstacle.

For example, the obstacles may be distinguished to the key obstacle and the non-key obstacle according to their respective types. For example, a movable obstacle may be taken as a key obstacle, and an immovable obstacle may be taken as a non-key obstacle.

For another example, an obstacle whose distance to the autonomous driving vehicle is less than a threshold may be taken as a key obstacle, and obstacles other than the key obstacle in the scene may be taken as non-key obstacles.

In this implementation, the key obstacle and the non-key obstacle may be distinguished in the problematic scene, so that a real device can be utilized to simulate a key obstacle, and a virtual model can be utilized to simulate a non-key obstacle, and thus an environment similar to the actual problematic scene may be highly reproduced by means of virtual and real combination.

In an optional implementation, the key obstacle in the problematic scene may also be determined by a user. Specifically, the problematic scene may be generated and displayed according to information of respective obstacles in the problematic scene data; a key obstacle in the problematic scene may be marked in response to a marking instruction acting on the displayed problematic scene; and the obstacle parameter file is generated according to obstacle information and the marked key obstacle.

The problematic scene may be displayed according to the problematic scene data, for example, the problematic scene may be dynamically displayed by means of a video. For example, if the problematic scene data is data with a length of 120 s, a video with a length of 120 s may be displayed.

Specifically, the user may operate in the displayed problematic scene, and mark a key obstacle therein. For example, the user may click to select a displayed obstacle, and the selected obstacle is the key obstacle. An unmarked obstacle is the non-key obstacle.

The obstacle parameter file may be generated according to information of respective obstacles displayed in the problematic scene and the key obstacle marked by the user. The obstacle parameter file includes information of each key obstacle, and also includes information of each non-key obstacle. In this implementation, the user may observe the problematic scene, and then determine a key obstacle that has an effect on a normal driving of the vehicle from a perspective of driving the vehicle.

Step 304, determine the key obstacle information and the non-key obstacle information according to the obstacle parameter file.

When the obstacles are simulated by utilizing the real device and the virtual model, the key obstacle information and the non-key obstacle information may be determined according to the obstacle parameter file. For example, the obstacle parameter file may be generated by a scene data mining module, and the obstacle parameter file is utilized by a virtual-real combination test system to simulate the obstacles.

The obstacle parameter file may include information of the obstacles, and may also include information about whether an obstacle is a key obstacle. For example, a variable i may be set to identify whether an obstacle is a key obstacle, and if the variable i of an obstacle is 1, the obstacle may be regarded as a key obstacle.

Specifically, information of the key obstacle may be regarded as the key obstacle information, and information of the non-key obstacle may be regarded as the non-key obstacle information.

Step 305, generate, by utilizing a virtual scene controller, a virtual obstacle model according to a contour and a size in the non-key obstacle information; determine, by utilizing a real device controller, a real device used to simulate the key obstacle according to the key obstacle information; where a real device is a device that actually exists in a test environment.

Further, a virtual scene controller may be set in advance, and the virtual scene controller can generate a virtual obstacle model.

In practical applications, the non-key obstacle information of respective non-key obstacles may be input into the virtual scene controller, so that the virtual scene controller can generate virtual obstacle models corresponding to respective non-key obstacles.

The non-key obstacle information may include the contour and the size of the obstacle, and the virtual scene controller may generate a virtual obstacle model similar in size and shape to a non-key obstacle according to the contour and the size of the non-key obstacle, so that the virtual obstacle model is more similar to the non-key obstacle encountered during the test in the problematic scene, and then the problematic scene can be reproduced more accurately.

Specifically, the real device controller may also be set in advance, and the key obstacle information of respective key obstacles may be input into the real device controller, so that the real device controller can determine real devices similar to the key obstacles, can also connect to these real devices, and then control the real devices.

The key obstacle information may, for example, include information of a type or a contour, a size, etc., of a key obstacle, and the real device controller may determine a real device similar to the key obstacle according to the type or the contour and the size of the key obstacle, so that the real device is more similar to the key obstacle encountered during the test in the problematic scene, and then the problematic scene can be reproduced more accurately.

The type of the key obstacle may be, for example, a vehicle, a pedestrian, etc. For example, a real vehicle may be utilized to simulate a key obstacle whose type is a vehicle, and for example, a robot may be utilized to simulate a key obstacle whose type is a pedestrian.

Step 306, start an autonomous driving vehicle equipped with a second autonomous driving system; where the second autonomous driving system is a system obtained after the first autonomous driving system is optimized.

Specifically, when it is found that the first autonomous driving system may not be able to handle some problematic scenes, or when it is found that the first autonomous driving system has problems during controlling the vehicle in a specific problematic scene, the first autonomous driving system may be optimized for these problems, to obtain the second autonomous driving system.

Further, a reproduction test may be performed on the autonomous driving vehicle equipped with the second autonomous driving system, so as to determine whether the second autonomous driving system can handle the above problematic scene reasonably.

In practical applications, the autonomous driving vehicle equipped with the second autonomous driving system may be started, so that the autonomous driving vehicle can drive in the reproduced problematic scene.

Step 307, control, according to the non-key obstacle information, the virtual obstacle model to move, and control, according to the key obstacle information, the real device to move, so as to simulate the problematic scene.

The generated virtual obstacle model may be controlled, according to the non-key obstacle information, to move. Specifically, the virtual obstacle model may be controlled to move, according to the non-key obstacle information corresponding to the virtual obstacle model. For example, a first virtual obstacle model is generated based on first non-key obstacle information, and then the first virtual obstacle model may be controlled according to the first non-key obstacle information. Specifically, the first virtual obstacle model may be controlled to take actions such as moving, rotating, etc.

Specifically, if the virtual obstacle model is a model used to simulate a stationary obstacle, a position of the virtual obstacle model remains unchanged.

Further, the real device may be controlled, according to the key obstacle information, to move. Specifically, the real device may be controlled to move according to the key obstacle information corresponding to the real device. For example, a first real device is determined based on first key obstacle information, and then the first real device may be controlled according to the first key obstacle information. Specifically, the first real device may be controlled to take actions such as moving, rotating, etc.

In practical applications, the problematic scene can be simulated in this way, and then a vehicle equipped with the second autonomous driving system may be tested based on the simulated problematic scene.

The non-key obstacle information includes movement information corresponding to each moment of the problematic scene. The virtual obstacle model may be controlled to move according to the moment when the autonomous driving vehicle equipped with the second autonomous driving system is started and according to the movement information corresponding to each moment of the problematic scene in the non-key obstacle information.

Specifically, the key obstacle information includes movement information corresponding to each moment of the problematic scene. The real device may be controlled to move according to the moment when the autonomous driving vehicle equipped with the second autonomous driving system is started and according to the movement information corresponding to each moment of the problematic scene in the key obstacle information.

Further, when the autonomous driving vehicle equipped with the second autonomous driving system is started, a problematic scene may be constructed in real time according to the key obstacle information and the non-key obstacle information.

In practical applications, if a problematic scene needed to be constructed is a problematic scene encountered when a vehicle equipped with the first autonomous driving system is started, then, at a start moment of the autonomous driving vehicle equipped with the second autonomous driving system, the virtual obstacle model may be controlled to move directly according to movement information corresponding to each moment of the problematic scene in the non-key obstacle information, and the real device may be controlled to move according to movement information corresponding to each moment of the problematic scene in the key obstacle information.

The movement information included in the key obstacle information and/or the non-key obstacle information may specifically include one or more of the following information: a speed, a course, and a position.

In an optional implementation, a start moment of the vehicle may be taken as an initial moment t0 of the problematic scene.

In another optional implementation, at the start moment of the vehicle, it is possible to prepare to control each virtual obstacle model and each real device. In addition, according to a real problematic scene, a moment when a driving speed of the autonomous driving vehicle reaches a specified speed may be taken as an initial moment t0 of the problematic scene, or a moment when relative positions between a position of the autonomous driving vehicle and each virtual obstacle model as well as each real device meet those in the real problematic scene may be taken as an initial moment t0 of the problematic scene.

If there is a piece of non-key obstacle information, which specifically includes movement information corresponding to each moment of the problematic scene, for example, movement information corresponding to moment t0 to moment tn, a position of the virtual obstacle model corresponding to the non-key obstacle information may be taken as a position corresponding to the moment to, and when moment t1 reaches, the virtual obstacle model is controlled to move to a position corresponding to moment t1 in the non-key obstacle information at a speed and a course corresponding to moment t1 in the non-key obstacle information.

In this implementation, the generated virtual obstacle model can be controlled, and a movement of the virtual obstacle model can be controlled to be consistent with the real problematic scene, then a non-key obstacle encountered when the vehicle drives on an open road can be reproduced accurately, and the problematic scene can be reproduced accurately.

In practical applications, the real device controller may be utilized to control the real device to move. For example, the real device controller may send controlling instructions to the real device, so as to control the real device to move.

The real device controller may generate, according to the key obstacle information, controlling instructions used to control the real device. For example, controlling instructions may be generated according to the initial moment t0 of the problematic scene in a real world, and according to a speed, a course, and a position corresponding to each moment in the problematic scene included in the key obstacle information. For example, a first controlling instruction may be generated at moment t1 of the problematic scene, and a second controlling instruction may be generated at moment t2 of the problematic scene. The controlling instructions may include a moving direction, a moving speed, a target position, etc.

In this implementation, the determined real device can be controlled, and a movement of the real device can be controlled to be consistent with the real problematic scene, then the key obstacle encountered when the vehicle drives on an open road can be reproduced accurately, and the problematic scene can be reproduced accurately.

Step 308, control, based on the second autonomous driving system, the autonomous driving vehicle to drive in the simulated problematic scene.

The second autonomous driving system on the autonomous driving vehicle may be utilized to formulate a driving strategy, and control the autonomous driving vehicle to drive in the simulated problematic scene.

After the autonomous driving vehicle is started, the autonomous driving vehicle may drive normally, the virtual obstacle model and the real device can be controlled to move according to a vehicle condition of the autonomous driving vehicle, so that the simulated scene can highly reproduce the problematic scene in the open road.

The second autonomous driving system can sense the virtual obstacle model and the real device, and then formulate a driving strategy according to these obstacles, and control the driving of the vehicle. If the optimized second autonomous driving system can handle the problematic scene reasonably, the autonomous driving vehicle can drive smoothly and safely in the highly reproduced problematic scene.

Optionally, after the reproduction test is performed on the autonomous driving vehicle equipped with the second autonomous driving system, the method provided in the present application may further include:

Step 309, obtain a driving state of the autonomous driving vehicle equipped with the second autonomous driving system in the simulated problematic scene, first movement data corresponding to the virtual obstacle model, and second movement data corresponding to the real device.

Optionally, after the test on the autonomous driving vehicle equipped with the second autonomous driving system based on the reproduced problematic scene is completed, data of the reproduction test may also be obtained, which may specifically include the driving state of the autonomous driving vehicle equipped with the second autonomous driving system in the simulated problematic scene, the first movement data corresponding to the virtual obstacle model, and the second movement data corresponding to the real device.

The second autonomous driving system in the autonomous driving vehicle or other electronic devices provided in the autonomous driving vehicle may record a driving state of the vehicle.

The driving state may specifically include a speed, a course, etc., of the vehicle, and may also include controlling information of the vehicle, for example, information for controlling the vehicle to brake suddenly, controlling the vehicle to accelerate, turn, etc. Information about the surrounding environment sensed by the vehicle, for example, information of an identified obstacle, a distance to a surrounding obstacle, etc., may also be included.

Specifically, the first movement data corresponding to each virtual obstacle model may also be obtained. For example, information about a moving speed, a direction, a position, etc., of each virtual obstacle model at each moment during the test is obtained.

The second movement data corresponding to each real device may also be obtained. For example, information about a moving speed, a direction, a position, etc., of each real device at each moment during the test is obtained.

Step 310, generate a test report according to the driving state, the first movement data, and the second movement data.

Further, the method provided in the present application may also generate a test report for the reproduction test according to the driving state of the vehicle, the first movement data of the virtual obstacle, and the second movement data of the real device, so that the user can directly determine whether the second autonomous driving system can handle the problematic scene reasonably according to the test report, and the user doesn't need to analyze the data of the reproduction test and then determine whether the second autonomous driving system meets requirements. This implementation can improve an efficiency for analyzing the reproduction test result.

In practical applications, test data corresponding to preset data may be generated according to the driving state, the first movement data, and the second movement data; the preset data is data being set in advance and corresponding to the problematic scene.

The preset data corresponding to the problematic scene may be set in advance, for example, the preset data may be a speed of the vehicle, for example, in the problematic scene, when the autonomous driving vehicle is at a distance of 2 meters from the obstacle, the vehicle speed should be less than a preset vehicle speed. On this occasion, the preset vehicle speed is the preset data.

Specifically, the test data corresponding to the preset data may be generated according to the driving state, the first movement data, and the second movement data. For example, if the preset data is a vehicle speed under a specific condition, then a vehicle speed under the above specific condition may be generated according to the driving state of the vehicle during the test, the first movement data, and the second movement data, and in such case, the vehicle speed under the specific condition is the test data.

Further, the test report may be generated according to the preset data and the test data. Specifically, a test report including the preset data and the test data may be generated by means of comparison, so that the user can intuitively understand whether the test data meets the preset data when a reproduction test is performed on the autonomous driving vehicle equipped with the second autonomous driving system, and then determine that the second autonomous driving system can handle the problematic scene reasonably.

Figure 4:
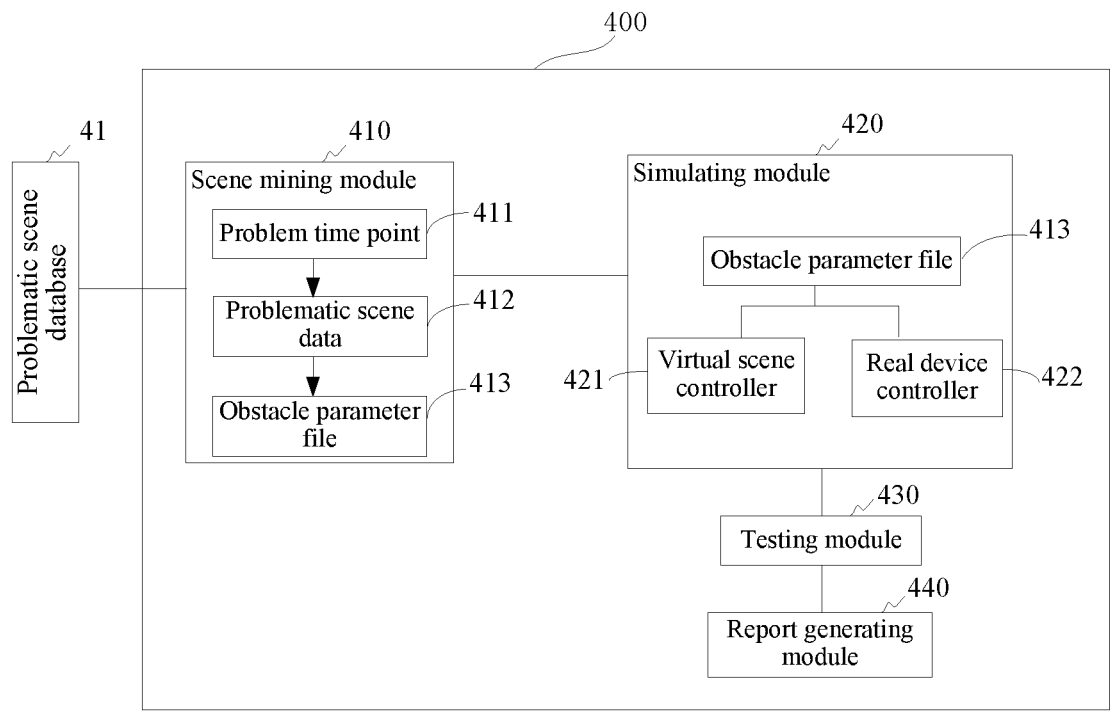
FIG. 4 is a schematic diagram of a scene reproduction test system of an autonomous driving system shown in an illustrative embodiment of the present application.

FIG. 4 is a schematic diagram of a scene reproduction test system of an autonomous driving system shown in an illustrative embodiment of the present application.

As shown in FIG. 4, any of the above scene reproduction test methods of the autonomous driving system may be performed by the scene reproduction test system 400 of the autonomous driving system.

In the scene reproduction test system 400 of the autonomous driving system, a scene mining module 410 may be included. The scene mining module 410 may be connected to a problematic scene database 41, to obtain a problem time point 411 from the problematic scene database 41, and then obtain problematic scene data 412 according to the problem time point 411.

The scene mining module 410 may also extract data from the problematic scene data 412, generate and display the problematic scene, so that a user can mark in the displayed problematic scene. The scene mining module 410 may generate an obstacle parameter file 413 including key obstacle information and non-key obstacle information according to a marking result of the user.

In the scene reproduction test system 400 of the autonomous driving system, a simulating module 420 may also be included. The simulating module 420 may read the obstacle parameter file 413 generated by the scene mining module 410, and specifically, may read parameters of obstacles from the obstacle parameter file 413. A virtual scene controller 421 is then utilized to generate a virtual obstacle model, and a real device controller 422 is utilized to determine a real device.

In the scene reproduction test system 400 of the autonomous driving system, a testing module 430 may also be included. The testing module 430 may connect an autonomous driving vehicle equipped with a second autonomous driving system to the simulating module 420, and then perform a test on the autonomous driving vehicle equipped with the second autonomous driving system by utilizing the problematic scene simulated by the simulating module 420. Specifically, the connected autonomous driving vehicle may be started, and according to a start time of the autonomous driving vehicle or according to a driving state of the autonomous driving vehicle, the problematic scene may be constructed in real time by utilizing the virtual obstacle model and the real device.

In the scene reproduction test system 400 of the autonomous driving system, a report generating module 440 may also be included. The report generating module 440 may obtain a driving state of the autonomous driving vehicle during the test, and may also obtain first movement data corresponding to the virtual obstacle model, and second movement data corresponding to the real device, and generate a test report according the data.

The above various modules of the scene reproduction test system 400 may be deployed in a same device, and may also be deployed in multiple devices, which is not limited in the present application.

Figure 5:
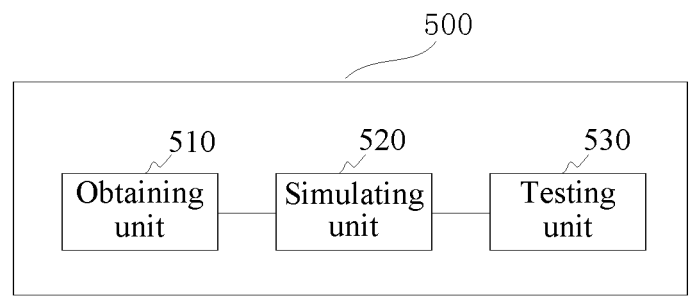
FIG. 5 is a structural diagram of a scene reproduction test apparatus of an autonomous driving system shown in an illustrative embodiment of the present application.

FIG. 5 is a structural diagram of a scene reproduction test apparatus of an autonomous driving system shown in an illustrative embodiment of the present application.

As shown in FIG. 5, the scene reproduction test apparatus 500 of the autonomous driving system provided by the present application includes:

an obtaining unit 510, configured to obtain problematic scene data generated during a test on an autonomous driving vehicle equipped with a first autonomous driving system, and determine key obstacle information and non-key obstacle information according to the problematic scene data;

a simulating unit 520, configured to generate, according to the non-key obstacle information, a virtual obstacle model, and determine, according to the key obstacle information, a real device used to simulate a key obstacle; where the real device is a device that actually exists in a test environment;

a testing unit 530, configured to perform, by utilizing the virtual obstacle model and the real device, a reproduction test on an autonomous driving vehicle equipped with a second autonomous driving system; where the second autonomous driving system is a system obtained after the first autonomous driving system is optimized; and the reproduction test is used to perform a reproduction test in a problematic scene represented by the problematic scene data.

The scene reproduction test apparatus of the autonomous driving system provided by the present application is similar to the embodiment shown in FIG. 2, and will not be repeated herein.

Figure 6:
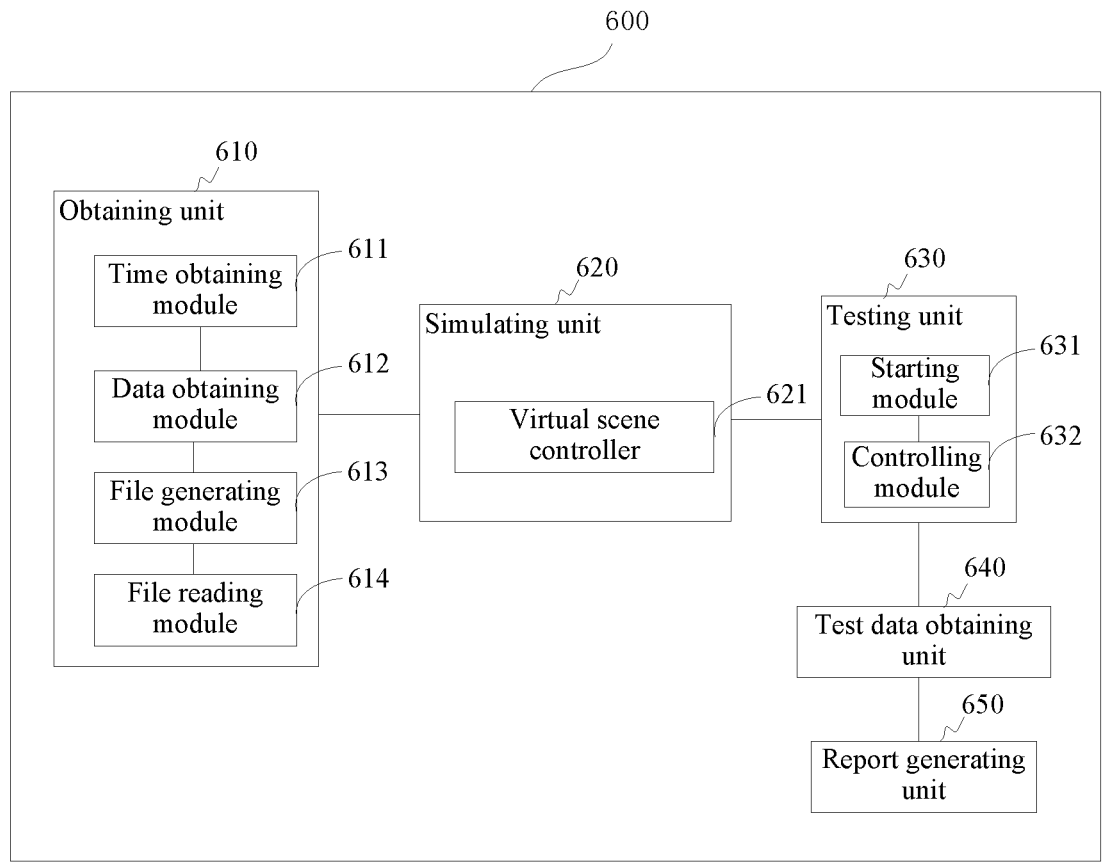
FIG. 6 is a structural diagram of a scene reproduction test apparatus of an autonomous driving system shown in an illustrative embodiment of the present application.

FIG. 6 is a structural diagram of a scene reproduction test apparatus of an autonomous driving system shown in an illustrative embodiment of the present application.

As shown in FIG. 6, an obtaining unit 610 in this embodiment is similar to the obtaining unit 510 shown in FIG. 5, a simulating unit 620 in this embodiment is similar to the simulating unit 520 shown in FIG. 5, and a testing unit 630 in this embodiment is similar to the testing unit 530 shown in FIG. 5.

On this basis, in the scene reproduction test apparatus 600 of an autonomous driving system provided in this embodiment, the obtaining unit 610 includes:

a time obtaining module 611, configured to determine a problem time point corresponding to the autonomous driving vehicle equipped with the first autonomous driving system according to a problematic scene database;

a data obtaining module 612, configured to obtain, according to the problem time point, the problematic scene data corresponding to the problem time point from road test data of the autonomous driving vehicle equipped with the first autonomous driving system;

where the problematic scene database is provided with time information of a problematic scene encountered during a test on the autonomous driving vehicle on an open road.

Optionally, the time obtaining module 611 is specifically configured to:

take, from the road test data of the autonomous driving vehicle equipped with the first autonomous driving system, first data which has a data generation time within a preset time period before the problem time point and second data which has a data generation time within a preset time period after the problem time point, as the problematic scene data.

Optionally, the obtaining unit 610 includes:

a file generating module 613, configured to generate an obstacle parameter file according to the problematic scene data; where the obstacle parameter file includes the key obstacle information and the non-key obstacle information;

a file reading module 614, configured to determine the key obstacle information and the non-key obstacle information according to the obstacle parameter file.

Optionally, the file generating module 613 is specifically configured to:

generate and display the problematic scene according to various obstacle information in the problematic scene data;

mark the key obstacle in the problematic scene in response to a marking instruction acting on the displayed problematic scene;

generate the obstacle parameter file according to the obstacle information and the marked key obstacle.

Optionally, the non-key obstacle information includes a contour and a size;

the simulating unit 620 includes a virtual scene controller 621, configured to:

generate a virtual obstacle model according to the contour and the size in the non-key obstacle information.

Optionally, the testing unit 630 includes:

a starting module 631, configured to start an autonomous driving vehicle equipped with a second autonomous driving system;

a controlling module 632, configured to control, according to the non-key obstacle information, the virtual obstacle model to move, and control, according to the key obstacle information, the real device to move, to simulate the problematic scene;

the controlling module 632 is also configured to control, based on the second autonomous driving system, the autonomous driving vehicle to drive in the simulated problematic scene.

Optionally, the non-key obstacle information includes movement information corresponding to each moment of the problematic scene; the controlling module 632 is specifically configured to:

control, according to a time when the autonomous driving vehicle equipped with the second autonomous driving system is started and the movement information corresponding to each moment of the problematic scene in the non-key obstacle information, the virtual obstacle model to move.

Optionally, the key obstacle information includes movement information corresponding to each moment of the problematic scene;

the controlling module 632 is specifically configured to:
control, according to a time when the autonomous driving vehicle equipped with the second autonomous driving system is started and the movement information corresponding to each moment of the problematic scene in the key obstacle information, the real device to move.

Optionally, the apparatus 600 further includes:
a test data obtaining unit 640, configured to obtain a driving state of the autonomous driving vehicle equipped with the second autonomous driving system in the simulated problematic scene, first movement data corresponding to the virtual obstacle model, and second movement data corresponding to the real device;
a report generating unit 650, configured to generate a test report according to the driving state, the first movement data and the second movement data.

Optionally, the report generating unit 650 includes:
an analyzing module 651, configured to generate test data corresponding to preset data according to the driving state, the first movement data and the second movement data; the preset data is data being set in advance and corresponding to the problematic scene;
a generating module 652, configured to generate the test report according to the preset data and the test data.

According to embodiments of the present application, the present application also provides an electronic device and a readable storage medium.

According to an embodiment of the present application, the present application also provides a computer program product, the computer program product includes: a computer program, the computer program is stored in a readable storage medium, at least one processor of an electronic device may read the computer program from the readable storage medium, and the at least one processor executes the computer program to cause the electronic device to perform the solution provided in any of the foregoing embodiments.

Figure 7:
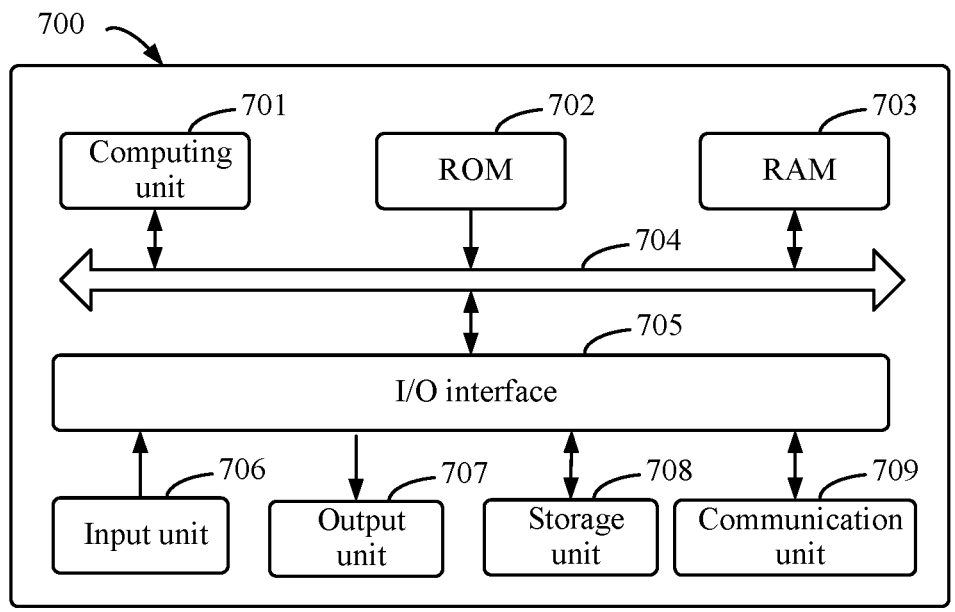
FIG. 7 is a block diagram of an electronic device used to implement the scene reproduction test method of an autonomous driving system according to an embodiment of the present application.

FIG. 7 shows a schematic block diagram of an example electronic device 700 that may be used to implement embodiments of the present application. The electronic device is intended to represent various forms of digital computers, such as a laptop computer, a desktop computer, a workstation, a personal digital assistant, a server, a blade server, a mainframe computer, and other suitable computers. The electronic device may also represent various forms of mobile apparatuses, such as a personal digital assistant, a cellular phone, a smart phone, a wearable device, and other similar computing apparatuses. Components, their connections and relationships, and their functions shown herein are merely examples, and are not intended to limit implementation of the present application described and/or required herein.

As shown in FIG. 7, the electronic device 700 includes a computing unit 701, which may perform various appropriate actions and processing according to a computer program stored in a read-only memory (ROM) 702 or a computer program loaded from a storage unit 708 to a random-access memory (RAM) 703. In the RAM 703, various programs and data required for operations of the device 700 may also be stored. The computing unit 701, the ROM 702, and the RAM 703 are connected to each other by a bus 704. An input/output (I/O) interface 705 is also connected to the bus 704.

A number of components in the device 700 are connected to the I/O interface 705, including: an input unit 706, for example, a keyboard, a mouse, etc.; an output unit 707, for example, various types of displays, speakers, etc.; a storage unit 708, for example, a disk, an optical disc, etc.; and a communication unit 709, for example, a network card, a modem, a wireless communication transceiver, etc. The communication unit 709 allows the device 700 to exchange information/data with other devices through a computer network such as the Internet and/or various telecommunication networks.

The computing unit 701 may be various types of general-purpose and/or special-purpose processing components with processing and computing capabilities. Some examples of the computing unit 701 include, but are not limited to, a central processing unit (CPU), a graphics processing unit (GPU), various dedicated artificial intelligence (AI) computing chips, various computing units for running machine learning model algorithms, a digital signal processor (DSP), and any appropriate processor, controller, microcontroller, etc. The computing unit 701 executes the various methods and processing described above, for example, the scene reproduction test method of an autonomous driving system. For example, in some embodiments, the scene reproduction test method of an autonomous driving system may be implemented as a computer software program, which is tangibly contained in a machine-readable medium, for example, the storage unit 708. In some embodiments, part or all of computer programs may be loaded into and/or installed on the device 700 via the ROM 702 and/or the communication unit 709. When the computer program is loaded into the RAM 703 and executed by the computing unit 701, one or more steps of the scene reproduction test method of the autonomous driving system described above may be performed. Alternatively, in other embodiments, the computing unit 701 may be configured to perform the scene reproduction test method of the autonomous driving system by means of any other appropriate means (for example, by means of firmware).

Various embodiments of the system and the technology described above herein may be implemented in a digital electronic circuit system, an integrated circuit system, a field programmable gate array (FPGA), an application specific integrated circuit (ASIC), an application specific standard product (ASSP), a system on chip (SOC), a load programmable logic device (CPLD), a computer hardware, firmware, software, and/or a combination thereof. These various embodiments may include: being implemented in one or more computer programs, where the one or more computer programs may be executed and/or interpreted on a programmable system including at least one programmable processor, and the programmable processor may be a dedicated or general-purpose programmable processor that may receive data and instructions from a storage system, at least one input apparatus and at least one output apparatus, and transmit data and instructions to the storage system, the at least one input apparatus and the at least one output apparatus.

Program codes used to implement the method of the present disclosure may be written in any combination of one or more programming languages. These program codes may be provided to a processor or a controller of a general-purpose computer, a special-purpose computer, or other programmable data processing devices, so that when the program codes are executed by the processor or the controller, functions/operations specified in flowcharts and/or block diagrams are implemented. The program codes may be entirely executed on a machine, partly executed on the machine, and as independent software packages, partly executed on the machine and partly executed on a remote machine, or entirely executed on a remote machine or a server.

In the context of the present disclosure, a machine-readable medium may be a tangible medium, which may contain or store a program for use by an instruction execution system, apparatus, or device or for use in combination with the instruction execution system, apparatus, or device. The machine-readable medium may be a machine-readable signal medium or a machine-readable storage medium. The machine-readable medium may include, but is not limited to, an electronic, a magnetic, an optical, an electromagnetic, an infrared, or a semiconductor system, apparatus, or device, or any suitable combination of the foregoing. More specific examples of the machine-readable storage media would include an electrical connection based on one or more wires, a portable computer disk, a hard disk, a random-access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing.

In order to provide an interaction with a user, the system and the technology described herein may be implemented on a computer, the computer is equipped with: a displaying apparatus for displaying information to the user (for example, a CRT (cathode ray tube) or an LCD (liquid crystal display) monitor); and a keyboard and a pointing apparatus (for example, a mouse or a trackball) through which the user may provide input to the computer. Other types of apparatuses may also be used to provide an interaction with the user; for example, feedbacks provided to the user may be any form of sensory feedbacks (for example, a visual feedback, an auditory feedback, or a tactile feedback); and input from the user may be received in any form (including an acoustic input, a voice input, or a tactile input).

The system and the technology described herein may be implemented in a computing system (for example, as a data server) that includes a back-end component, or a computing system (for example, an application server) that includes a middleware component, or a computing system (for example, a user computer with a graphical user interface or a web browser through which the user may interact with the embodiments of the system and the technology described herein) that includes a front-end component, or a computing system that includes any combination of the back-end component, the intermediate component or the front-end component. Components of the system may be connected to each other through digital data communication (for example, a communication network) of any form or medium. Examples of the communication network include: a local area network (LAN), a wide area network (WAN), and the Internet.

A computer system may include a client and a server. The client and the server are generally far away from each other and usually interact through a communication network. A relationship between the client and the server is generated by computer programs that run on corresponding computers and have a client-server relationship with each other. The server may be a cloud server, also known as a cloud computing server or a cloud host, which is a host product in a cloud computing service system, to solve defects of high management difficulty and weak business scalability existing in services of a traditional physical host and a virtual private server (VPS). The server may also be a server of a distributed system, or a server combined with a block chain.

It should be understood that various forms of procedures shown above may be used, and steps may be reordered, added or deleted. For example, each of the steps recorded in the present application may be performed in parallel, may also be performed sequentially, may also be performed in a different order, as long as a desired result of the technical solution disclosed in the present application may be realized, and this is not limited herein.

The above specific embodiments do not constitute a limitation to the protection scope of the present application. Those skilled in the art should understand that various modifications, combinations, sub-combinations and substitutions may be made according to design requirements and other factors. Any modification, equivalent replacement, improvement and so on made within the spirit and the principle of the present application shall be included in the protection scope of the present application.

What is claimed is:

1. A scene reproduction test method of an autonomous driving system, comprising:
    obtaining problematic scene data generated during a test on an autonomous driving vehicle equipped with a first autonomous driving system, and determining key obstacle information and non-key obstacle information according to the problematic scene data;
    generating, according to the non-key obstacle information, a virtual obstacle model, and determining, according to the key obstacle information, a real device used to simulate a key obstacle; wherein the real device is a device that actually exists in a test environment;
    performing, by utilizing the virtual obstacle model and the real device, a reproduction test on an autonomous driving vehicle equipped with a second autonomous driving system; wherein the second autonomous driving system is a system obtained after the first autonomous driving system is optimized; and the reproduction test is used to perform a reproduction test in a problematic scene represented by the problematic scene data.

2. The method according to claim 1, wherein the obtaining the problematic scene data generated during the test on the autonomous driving vehicle equipped with the first autonomous driving system comprises:
    determining, according to a problematic scene database, a problem time point corresponding to the autonomous driving vehicle equipped with the first autonomous driving system;
    obtaining, according to the problem time point, the problematic scene data corresponding to the problem time point from road test data of the autonomous driving vehicle equipped with the first autonomous driving system;
    wherein the problematic scene database is provided with time information of a problematic scene encountered during a test on the autonomous driving vehicle on an open road.

3. The method according to claim 2, wherein the obtaining, according to the problem time point, the problematic scene data corresponding to the problem time point from the road test data of the autonomous driving vehicle equipped with the first autonomous driving system comprises:
    taking, from the road test data of the autonomous driving vehicle equipped with the first autonomous driving system, first data which has a data generation time within a preset time period before the problem time point and second data which has a data generation time within a preset time period after the problem time point as the problematic scene data.

4. The method according to claim 1, wherein the determining the key obstacle information and the non-key obstacle information according to the problematic scene data comprises:
  generating an obstacle parameter file according to the problematic scene data; wherein the obstacle parameter file comprises the key obstacle information and the non-key obstacle information;
  determining the key obstacle information and the non-key obstacle information according to the obstacle parameter file.

5. The method according to claim 4, wherein the generating the obstacle parameter file according to the problematic scene data comprises:
  generating and displaying the problematic scene according to various obstacle information in the problematic scene data;
  marking a key obstacle in the problematic scene in response to a marking instruction acting on the displayed problematic scene;
  generating the obstacle parameter file according to the obstacle information and the marked key obstacle.

6. The method according to claim 1, wherein the non-key obstacle information comprises a contour and a size; the generating, according to the non-key obstacle information, the virtual obstacle model comprises:
  generating, by utilizing a virtual scene controller, the virtual obstacle model according to the contour and the size in the non-key obstacle information.

7. The method according to claim 1, wherein the performing, by utilizing the virtual obstacle model and the real device, the reproduction test on the autonomous driving vehicle equipped with the second autonomous driving system comprises:
  starting the autonomous driving vehicle equipped with the second autonomous driving system;
  controlling, according to the non-key obstacle information, the virtual obstacle model to move, and controlling, according to the key obstacle information, the real device to move, to simulate the problematic scene;
  controlling, based on the second autonomous driving system, the autonomous driving vehicle to drive in the simulated problematic scene.

8. The method according to claim 7, wherein the non-key obstacle information comprises movement information corresponding to each moment of the problematic scene; the controlling, according to the non-key obstacle information, the virtual obstacle model to move comprises:
  controlling, according to a moment when the autonomous driving vehicle equipped with the second autonomous driving system is started and the movement information corresponding to each moment of the problematic scene in the non-key obstacle information, the virtual obstacle model to move.

9. The method according to claim 7, wherein the key obstacle information comprises movement information corresponding to each moment of the problematic scene; the controlling, according to the key obstacle information, the real device to move comprises:
  controlling, according to a moment when the autonomous driving vehicle equipped with the second autonomous driving system is started and the movement information corresponding to each moment of the problematic scene in the key obstacle information, the real device to move.

10. The method according to claim 1, further comprising:
  obtaining a driving state of the autonomous driving vehicle equipped with the second autonomous driving system in the simulated problematic scene, first movement data corresponding to the virtual obstacle model, and second movement data corresponding to the real device;
  generating a test report according to the driving state, the first movement data, and the second movement data.

11. The method according to claim 10, wherein the generating the test report according to the driving state, the first movement data, and the second movement data comprises:
  generating test data corresponding to preset data according to the driving state, the first movement data, and the second movement data; wherein the preset data is data being set in advance and corresponding to the problematic scene;
  generating the test report according to the preset data and the test data.

12. An electronic device, comprising: at least one processor; and a memory communicatively connected with the at least one processor; wherein, the memory stores instructions executable by the at least one processor, and the instructions are executed by the at least one processor, so that the at least one processor is configured to:
  obtain problematic scene data generated during a test on an autonomous driving vehicle equipped with a first autonomous driving system, and determine key obstacle information and non-key obstacle information according to the problematic scene data;
  generate, according to the non-key obstacle information, a virtual obstacle model, and determine, according to the key obstacle information, a real device used to simulate a key obstacle; wherein the real device is a device that actually exists in a test environment;
  perform, by utilizing the virtual obstacle model and the real device, a reproduction test on an autonomous driving vehicle equipped with a second autonomous driving system; wherein the second autonomous driving system is a system obtained after the first autonomous driving system is optimized; and the reproduction test is used to perform a reproduction test in a problematic scene represented by the problematic scene data.

13. The electronic device according to claim 12, wherein the at least one processor is further configured to:
  determine, according to a problematic scene database, a problem time point corresponding to the autonomous driving vehicle equipped with the first autonomous driving system;
  obtain, according to the problem time point, the problematic scene data corresponding to the problem time point from road test data of the autonomous driving vehicle equipped with the first autonomous driving system;
  wherein the problematic scene database is provided with time information of a problematic scene encountered during a test on the autonomous driving vehicle on an open road.

14. The electronic device according to claim 13, wherein the at least one processor is further configured to:
  take, from the road test data of the autonomous driving vehicle equipped with the first autonomous driving system, first data which has a data generation time within a preset time period before the problem time point and second data which has a data generation time within a preset time period after the problem time point as the problematic scene data.

15. The electronic device according to claim 12, wherein the at least one processor is further configured to:
- generate an obstacle parameter file according to the problematic scene data; wherein the obstacle parameter file comprises the key obstacle information and the non-key obstacle information;
- determine the key obstacle information and the non-key obstacle information according to the obstacle parameter file.

16. The electronic device according to claim 15, wherein the at least one processor is further configured to:
- generate and display the problematic scene according to various obstacle information in the problematic scene data;
- mark a key obstacle in the problematic scene in response to a marking instruction acting on the displayed problematic scene;
- generate the obstacle parameter file according to the obstacle information and the marked key obstacle.

17. The electronic device according to claim 12, wherein the non-key obstacle information comprises a contour and a size;
the at least one processor is further configured to:
generate, by utilizing a virtual scene controller, the virtual obstacle model according to the contour and the size in the non-key obstacle information.

18. The electronic device according to claim 12, wherein the at least one processor is further configured to:
- start the autonomous driving vehicle equipped with the second autonomous driving system;
- control, according to the non-key obstacle information, the virtual obstacle model to move, and control, according to the key obstacle information, the real device to move, to simulate the problematic scene; and
- control, based on the second autonomous driving system, the autonomous driving vehicle to drive in the simulated problematic scene.

19. The electronic device according to claim 18, wherein the non-key obstacle information comprises movement information corresponding to each moment of the problematic scene; the at least one processor is further configured to:
- control, according to a moment when the autonomous driving vehicle equipped with the second autonomous driving system is started and the movement information corresponding to each moment of the problematic scene in the non-key obstacle information, the virtual obstacle model to move.

20. A non-transitory computer-readable storage medium storing computer instructions, wherein the computer instructions are used to cause a computer to execute the following steps:
- obtaining problematic scene data generated during a test on an autonomous driving vehicle equipped with a first autonomous driving system, and determining key obstacle information and non-key obstacle information according to the problematic scene data;
- generating, according to the non-key obstacle information, a virtual obstacle model, and determining, according to the key obstacle information, a real device used to simulate a key obstacle; wherein the real device is a device that actually exists in a test environment;
- performing, by utilizing the virtual obstacle model and the real device, a reproduction test on an autonomous driving vehicle equipped with a second autonomous driving system; wherein the second autonomous driving system is a system obtained after the first autonomous driving system is optimized; and the reproduction test is used to perform a reproduction test in a problematic scene represented by the problematic scene data.

* * * * *